United States Patent
Ramasamy et al.

(10) Patent No.: US 9,407,335 B2
(45) Date of Patent: Aug. 2, 2016

(54) METHOD AND WIRELESS COMMUNICATION DEVICE FOR USING AN ANTENNA AS A SENSOR DEVICE IN GUIDING SELECTION OF OPTIMIZED TUNING NETWORKS

(71) Applicant: Google Technology Holdings LLC, Mountain View, CA (US)

(72) Inventors: Suresh K. Ramasamy, Plantation, FL (US); Gregory R. Black, Vernon Hills, IL (US); Aaron L. Dietrich, Caledonia, IL (US); Gustavo D. Leizerovich, Aventura, FL (US); David H. Minasi, Fort Lauderdale, IL (US); Koon K. Shee, Miramar, FL (US)

(73) Assignee: Google Technology Holdings LLC, Mountain View, CA (US)

( * ) Notice: Subject to any disclaimer, the term of this patent is extended or adjusted under 35 U.S.C. 154(b) by 46 days.

(21) Appl. No.: 14/068,404

(22) Filed: Oct. 31, 2013

(65) Prior Publication Data

US 2015/0044977 A1 Feb. 12, 2015

Related U.S. Application Data

(60) Provisional application No. 61/862,740, filed on Aug. 6, 2013.

(51) Int. Cl.
*H04B 7/04* (2006.01)
*H04B 1/40* (2015.01)
(Continued)

(52) U.S. Cl.
CPC .............. *H04B 7/0404* (2013.01); *H01Q 1/44* (2013.01); *H03K 17/955* (2013.01); *H01Q 1/243* (2013.01)

(58) Field of Classification Search
CPC ......... H01Q 5/335; H01Q 1/241; H01Q 1/44; H01Q 1/243; H04B 1/38; H04B 7/04; H04B 1/40; H04B 1/18; H04B 1/0458; H03H 7/40; H03H 7/38; G06F 3/044; H04W 88/02
USPC ....................... 455/77, 566; 333/32
See application file for complete search history.

(56) References Cited

U.S. PATENT DOCUMENTS 6,657,595 B1 12/2003 Phillips et al.
6,862,433 B2 3/2005 Callaway, Jr.
(Continued)

FOREIGN PATENT DOCUMENTS

EP 2276108 A1 1/2011
EP 2276109 A1 1/2011
EP 2551955 A2 1/2013

OTHER PUBLICATIONS

Huttunen, Arttu et al.: "Capacitive Sensing of Antenna Loading With an R-C Voltage Divider in a Tunable Antenna", IEEE Sensors Journal, vol. 13, No. 2, Feb. 2013, all pages.
(Continued)

*Primary Examiner* — Pablo Tran
(74) *Attorney, Agent, or Firm* — Faegre Baker Daniels LLP

(57) ABSTRACT

A method and system performs antenna tuning using detected changes in antenna self-capacitance in a wireless communication device. A modem detects changes in antenna self-capacitance by utilizing multiple antenna elements. The modem determines a current antenna loading condition using the detected changes in antenna self-capacitance. The modem determines appropriate tuning states for each antenna matching and tuning circuit (AMTC) associated with a respective antenna element. In order to determine the appropriate tuning states, the modem utilizes pre-established antenna self-capacitance information which is mapped to antenna tuning states. The antenna tuning states which are respectively mapped to pre-established antenna self-capacitance are empirically pre-determined by correlating antenna self-capacitance changes to antenna impedance changes. The modem is thus able to change the tuning states of multiple tunable matching circuits and perform antenna tuning using (a) detected real-time changes in antenna self-capacitance and (b) pre-established mappings of antenna self-capacitance and antenna tuning states.

20 Claims, 7 Drawing Sheets

(51) Int. Cl.
*H01Q 1/44* (2006.01)
*H03K 17/955* (2006.01)
*H01Q 1/24* (2006.01)

(56) References Cited

U.S. PATENT DOCUMENTS

| | | | |
|---|---|---|---|
| 6,978,165 B2 * | 12/2005 | Martinez et al. | 455/575.7 |
| 8,204,446 B2 | 6/2012 | Scheer et al. | |
| 8,395,459 B2 | 3/2013 | Spears et al. | |
| 8,405,568 B2 * | 3/2013 | Knudsen et al. | 343/861 |
| 8,929,838 B2 * | 1/2015 | Klomsdorf et al. | 455/77 |
| 8,971,826 B2 * | 3/2015 | Abdul-Gaffoor et al. | 455/77 |
| 2003/0210203 A1 | 11/2003 | Phillips et al. | |
| 2004/0155860 A1 | 8/2004 | Wenstrand | |
| 2006/0132360 A1 | 6/2006 | Caimi et al. | |
| 2007/0222697 A1 | 9/2007 | Caimi et al. | |
| 2007/0238496 A1 | 10/2007 | Chung et al. | |
| 2009/0295648 A1 | 12/2009 | Dorsey et al. | |
| 2010/0062728 A1 | 3/2010 | Black et al. | |
| 2011/0012793 A1 | 1/2011 | Amm et al. | |
| 2011/0076966 A1 | 3/2011 | Ishimiya | |
| 2011/0105023 A1 | 5/2011 | Scheer et al. | |
| 2011/0250928 A1 | 10/2011 | Schlub et al. | |
| 2011/0281532 A1 | 11/2011 | Shin et al. | |
| 2012/0056795 A1 * | 3/2012 | Nagumo et al. | 343/787 |
| 2012/0154245 A1 * | 6/2012 | Nagumo et al. | 343/861 |
| 2012/0162037 A1 | 6/2012 | Duron et al. | |
| 2012/0214412 A1 | 8/2012 | Schlub et al. | |
| 2012/0295554 A1 | 11/2012 | Greene et al. | |
| 2012/0329524 A1 * | 12/2012 | Kent et al. | 455/566 |
| 2013/0005278 A1 * | 1/2013 | Black et al. | 455/77 |
| 2013/0045700 A1 | 2/2013 | Stallman et al. | |
| 2013/0052967 A1 | 2/2013 | Black et al. | |
| 2013/0063323 A1 | 3/2013 | Mankaruse et al. | |
| 2013/0069737 A1 * | 3/2013 | See et al. | 333/32 |
| 2013/0141306 A1 | 6/2013 | Chiang et al. | |
| 2013/0217342 A1 | 8/2013 | Abdul-Gaffoor et al. | |

OTHER PUBLICATIONS

European Patent Office; International Search Report and Written Opinion; International Application No. PCT/US2014/049837; dated Dec. 15, 2014.

Patent Cooperation Treaty, International Search Report and Written Opinion of the International Searching Authority for International Application No. PCT/US2013/026268; dated May 8, 2013.

* cited by examiner

FIG. 5

| | Antenna Self Capacitance (pF) @ 130 MHz | | ΔC(simulated) (FF to Loading) | Antenna Impedance @ 836 MHz | |
|---|---|---|---|---|---|
| | CTIA Right Hand | FF | | FF | CTIA Right Hand |
| CTIA Grip | 1.85 | 1.6 | 0.25pf | 5 – j14.9 | 11.8 + j1.4 |
| Grip # 1 | 2.7 | 1.6 | 1.1pf | | 19.6 + j59.2 |
| Grip # 2 | 1.7 | 1.6 | 0.1pf | | 13 – j6.8 |
| Grip # 3 | 1.66 | 1.6 | .06pf | | 8.2 – j14.7 |
| Grip # 4 | 5.4 | 1.6 | 3.8pf | | 45 + j189 |

| Hand Grip Positions | Change in antenna self capacitance from I2C output | | | Tx - Antenna | | | | PRx - Antenna | | | | DRx - Antenna | | | |
|---|---|---|---|---|---|---|---|---|---|---|---|---|---|---|---|
| | Tx (pF) | PRx (pF) | DRx (pF) | Freq (MHz) | Tuner #1 | Tuner# 2 | Tuner# 3 | Freq (MHz) | Tuner #1 | Tuner# 2 | Tuner# 3 | Freq (MHz) | Tuner #1 | Tuner #2 | Tuner# 3 |
| Grip#1 | 3 | 1 | 0.5 | 824 | 3.9 | 3.02 | 1.24 | 869 | 2.13 | 2.13 | 2.13 | 869 | 3.15 | 3.15 | 3.15 |
| Grip#2 | 2 | 0.5 | 0.25 | 824 | 1.0 | 1.2 | 1.4 | 869 | 0.5 | 1.0 | 1.2 | 869 | 2 | 1.0 | 0.5 |

600

602

METHOD AND WIRELESS COMMUNICATION DEVICE FOR USING AN ANTENNA AS A SENSOR DEVICE IN GUIDING SELECTION OF OPTIMIZED TUNING NETWORKS

BACKGROUND

1. Technical Field

The present disclosure relates in general to wireless communication devices and in particular to antenna tuning in wireless communication devices.

2. Description of the Related Art

The evolution of multi-band, multi-mode wireless communication technologies (e.g., Long Term Evolution (LTE), code division multiple access (CDMA) 1×, Evolution Data Optimized (EVDO), Universal Mobile Telecommunications System (UMTS) and Global System for Mobile Communications (GSM)) combined with a need for aggressive, unique and attractive design features and characteristics, such as borderless display for user equipment, has led to increasing demands for innovative antenna designs in which antennas utilize a much smaller space or "keep out" within the user equipment.

A more compact antenna design, which utilizes less space within the user equipment, increases the antenna q factor (Q) (i.e., more localized energy near the antenna). An increased antenna Q most likely indicates a narrowband antenna and causes the antenna to be more susceptible to de-tuning effects which occur when the corresponding wireless communication device is held within a user's hand or against the body, when compared to traditional antenna designs. These traditional antenna designs have a lower antenna Q, and operate over larger bandwidths, but utilize a larger space. De-tuning in a high Q antenna increases mismatch losses due to reflection and, as a result, the antenna system efficiency performance is negatively impacted.

BRIEF DESCRIPTION OF THE DRAWINGS

The described embodiments are to be read in conjunction with the accompanying drawings, wherein:

FIG. 5 is a table of pre-established values for antenna self-capacitance and corresponding antenna impedance values for various right hand grip positions, according to one embodiment;

FIG. 6 is a table of pre-established values for antenna self-capacitance and corresponding antenna tuning states, according to one embodiment.

DETAILED DESCRIPTION

Figure 1:
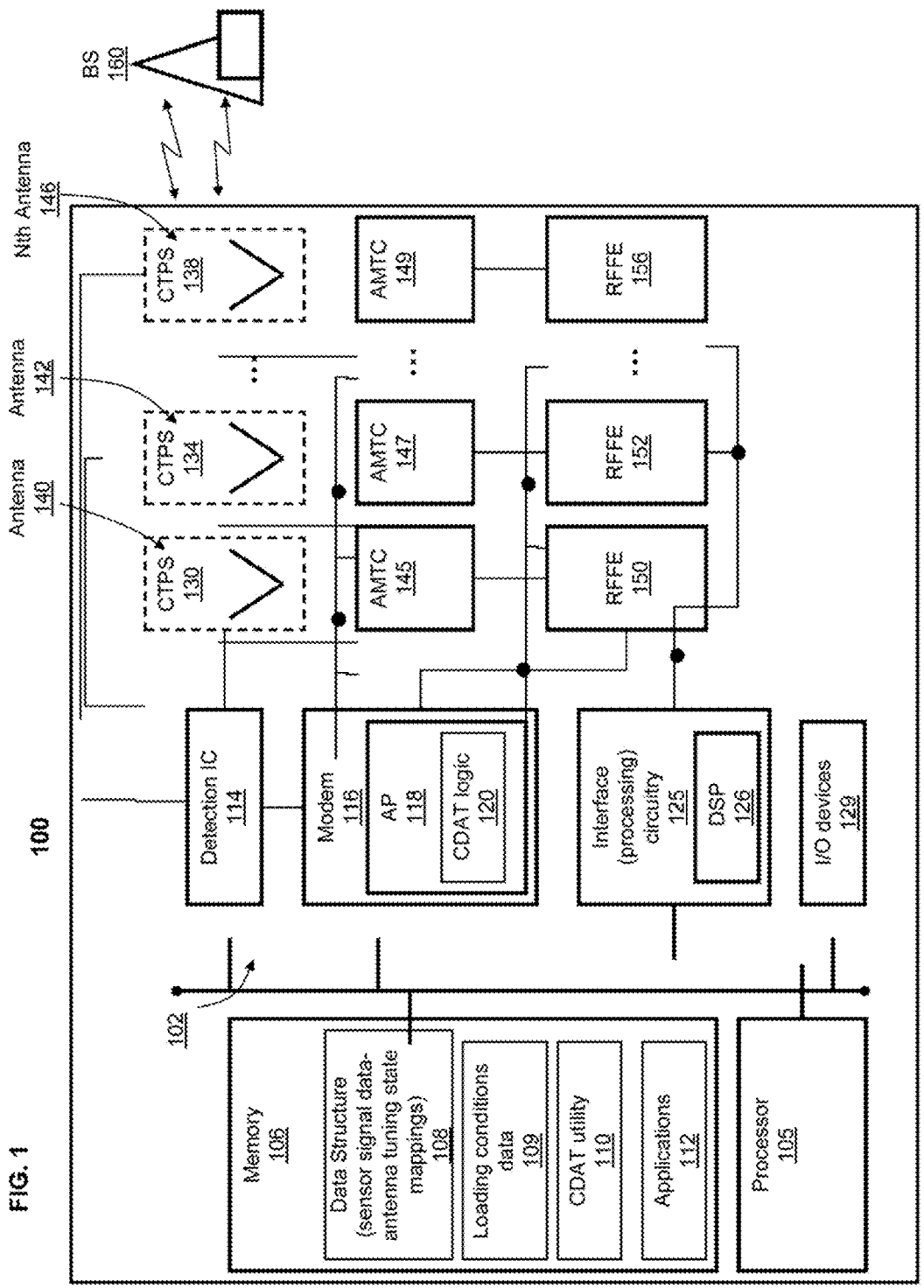
FIG. 1 is a block diagram of an example multi-antenna wireless communication device, within which the functional aspects of the described embodiments may be implemented.

The illustrative embodiments provide a method and system for performing antenna tuning using detected changes in antenna self-capacitance in a wireless communication device. A modem detects changes in antenna self-capacitance by utilizing multiple antenna elements. The modem determines a current antenna loading condition using the detected changes in antenna self-capacitance. The modem determines appropriate tuning states for each antenna matching and tuning circuit (AMTC) associated with a respective antenna element. In order to determine the appropriate tuning states, the modem utilizes pre-established antenna self-capacitance information which is mapped to antenna tuning states. The antenna tuning states which are respectively mapped to pre-established antenna self-capacitance are empirically pre-determined by correlating antenna self-capacitance changes to antenna impedance changes. The modem is thus able to change the tuning states of multiple tunable matching circuits and perform antenna tuning using (a) detected real-time changes in antenna self-capacitance and (b) pre-established mappings of antenna self-capacitance and antenna tuning states.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein.

With specific reference now to FIG. 1, there is depicted a block diagram of an example wireless communication device 100, within which the functional aspects of the described embodiments may be implemented. Wireless communication device 100 represents a device that is adapted to transmit and receive electromagnetic signals over an air interface via uplink and/or downlink channels between the wireless communication device 100 and communication network equipment (e.g., base-station 160) utilizing at least one communication standard, such as Global System for Mobile Communications (GSM), Code Division Multiple Access (CDMA), Orthogonal Frequency Division Multiple Access (OFDMA), Wireless Local Area Networks (WLAN) (e.g. WiFi) and other wireless communication systems. In one or more embodiments, the wireless communication device can be a mobile cellular device/phone or smartphone, or laptop, netbook or tablet computing device, or other types of communications devices.

Wireless communication device 100 comprises processor 105 and interface circuitry 125, which are connected to memory component 106 via signal bus 102. Interface circuitry 125 includes digital signal processor (DSP) 126. In addition, wireless communication device 100 comprises input/output (I/O) devices 129. Wireless communication device 100 also comprises detection integrated circuit (IC) 114 and modem 116 which is coupled to detection IC 114. In one or more embodiments, modem 116 comprises application processor (AP) 118. According to one aspect of the disclosure, AP 118 includes therein logic, such as Capacitive Detection and Antenna Tuning (CDAT) logic 120, which supports the various processing functions of modem 116. Also illustrated within wireless communication device 100 are multiple capacitive touch and proximity sensors (CTPSes) including first CTPS 130, second CTPS 134 and Nth CTPS 138. Each CTPS comprises a corresponding antenna element. As illustrated, first CTPS 130 comprises first antenna element 140, second CTPS 134 comprises second antenna element 142, and Nth CTPS 138 comprises Nth antenna element 146.

Also included within wireless communication device 100 are multiple antenna matching and tuning circuits (AMTCs) including first AMTC 145, second AMTC 147 and Nth AMTC 149. The AMTCs are respectively coupled to the CTPSes. Each AMTC includes at least one antenna tuner (not explicitly shown). In wireless communication device 100, these AMTCs collectively represent an advanced open loop tuning system. Wireless communication device 100 also includes multiple radio frequency front ends (RFFEs) for sending and receiving RF communication signals. For example, the RFFEs include first RFFE 150, second RFFE 152 and Nth RFFE 156.

An RFFE includes a number of RF circuit components including one or more power amplifiers (not illustrated). In at least some embodiments, the sending and receiving of RF communication signals occur wirelessly and are facilitated by one or more antennas/antenna elements 140, 142, 146 communicatively coupled to the RFFEs, respectively. The number of antenna elements can vary from device to device, ranging from one or more antenna elements and the presentation within wireless communication device 100 of a particular number (e.g., three or N) of antenna elements is merely for illustration.

Wireless communication device 100 is able to wirelessly communicate to base-station 160 via one or more antennas (e.g., antenna 140, 142, 146). Base station 160 can be any one of a number of different types of network stations and/or antennas associated with the infrastructure of the wireless network and configured to support uplink and downlink communication via one or more of the wireless communication protocols, as known by those skilled in the art.

In addition to the above described hardware components of wireless communication device 100, various features of the invention may be completed or supported via software or firmware code and/or logic stored within at least one of memory 106 and a local memory of modem 116, and respectively executed by DSP 126 or processor 105, or local/application processor 118 of modem 116. Thus, for example, included within system memory 106 and/or local memory of modem 116 are a number of software, firmware, logic components, or modules, including applications 112, data structure 108 comprising sensor signal data mapped to antenna tuning states, loading conditions data 109 and CDAT utility 110.

The various components within wireless communication device 100 can be electrically and/or communicatively coupled together as illustrated in FIG. 1. As utilized herein, the term "communicatively coupled" means that information signals are transmissible through various interconnections between the components. The interconnections between the components can be direct interconnections that include conductive transmission media, or may be indirect interconnections that include one or more intermediate electrical components. Although certain direct interconnections are illustrated in FIG. 1, it is to be understood that more, fewer or different interconnections may be present in other embodiments. The structural makeup of a number of RF components including the CTPSes and the connectivity of associated RF components are described in greater detail in FIG. 2.

Figure 2:
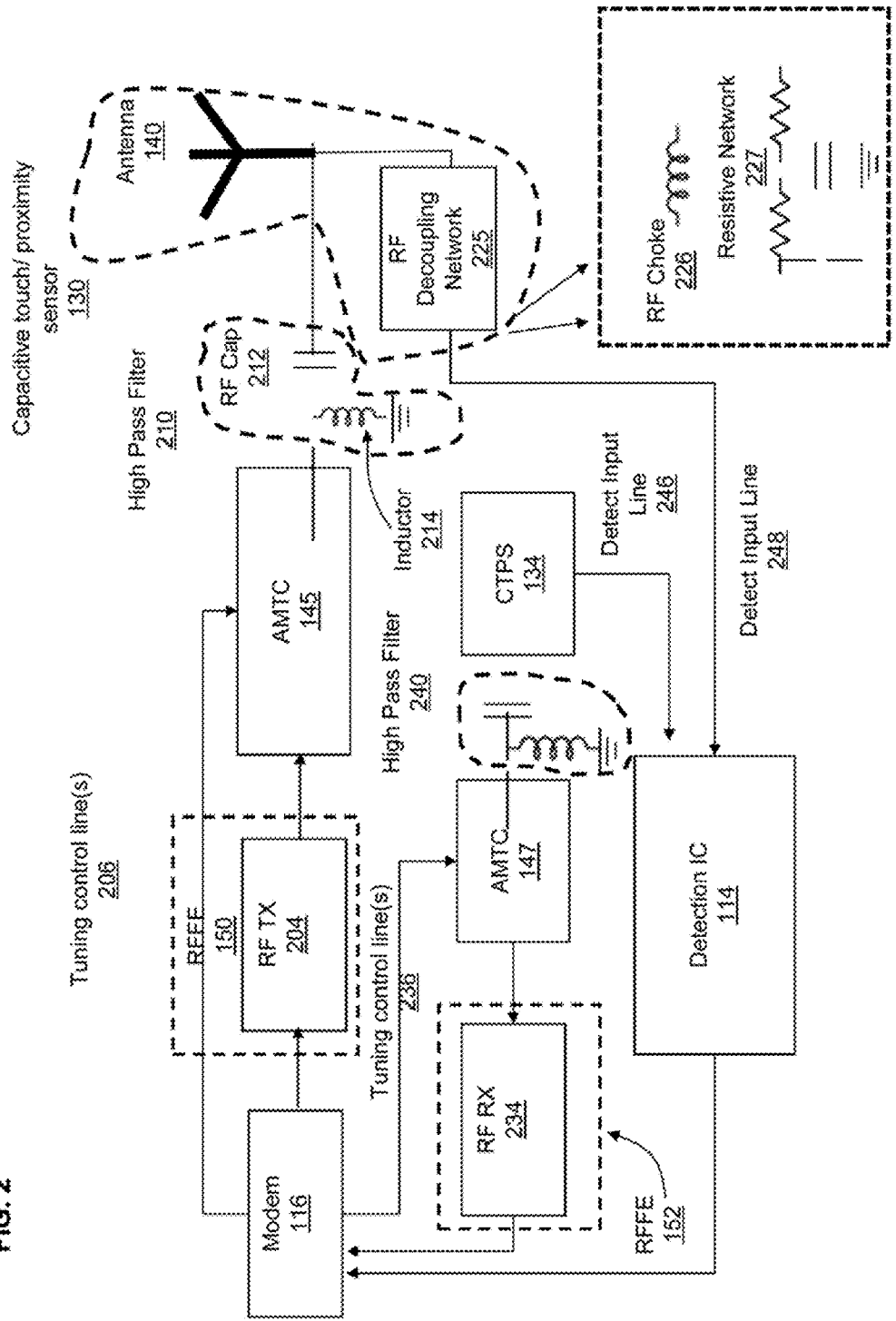
FIG. 2 provides a block diagram representation of a wireless communication device which utilizes capacitive touch and proximity sensors (CTPSes), which enable implementation of the described embodiments.

With specific reference now to FIG. 2, there is depicted a block diagram representation of a wireless communication device which utilizes multiple capacitive touch and proximity sensors (CTPSes), which enables completion of various features of the described embodiments, according to one embodiment. Wireless communication device (WCD) 200 comprises modem 116, first RFFE 150, which includes RF transmitter (TX) 204 and which is coupled to an output of modem 116, and first AMTC 145, which is coupled to an output of first RFFE 150. In addition, first AMTC 145 is coupled to modem 116 via tuning control line(s) 206. WCD 200 also comprises (first) CTPS 130. First AMTC 145 is communicatively coupled to first CTPS 130 via high pass filter (HPF) network 210. HPF network 210 comprises shunt inductor 214 and series RF capacitor 212 which is coupled to shunt inductor 214. First CTPS 130 comprises antenna 140 and RF decoupling network/circuit 225 coupled to antenna 140. In one implementation, RF decoupling network 225 comprises RF choke 226. In another implementation, RF decoupling network 225 is a resistive network 227 which comprises a first series resistor, a second series resistor and a shunt capacitor coupled between the first and second series resistors. Thus, as illustrated within an expanded block of RF decoupling network 225, RF decoupling network 225 is one of RF choke 226 and resistive network 227.

Wireless communication device (WCD) 200 also comprises second RFFE 152 which includes RF receiver (RX) 234 and which is coupled to an input of modem 116. WCD 200 also comprises second AMTC 147 which is coupled to an input of RFFE 152. In addition, AMTC 147 is coupled to modem 116 via tuning control line(s) 236. WCD 200 also comprises (second) CTPS 134. Second AMTC 147 is communicatively coupled to second CTPS 134 via high pass filter (HPF) network 240.

Wireless communication device (WCD) 200 also comprises detection IC 114 which is coupled to an input port of modem 116. Detection IC 114 is coupled to each of first CTPS 130 and second CTPS 134 via detect input line 248 and detect input line 246, respectively. In particular, each CTPS (e.g., CTPS 130) is coupled to detection IC 114 via an RF decoupling network (e.g., RF decoupling network 225). Although the components of CTPS 134 are not explicitly shown, CTPS 134 similarly includes (i.e., similar to CTPS 130) an RF decoupling network by which CTPS 134 is coupled to detection IC 114. Detection IC 114 detects a change in capacitance of a corresponding CTPS caused by proximity of an object to the antenna element, while the antenna element within the CTPS utilized to detect the change in antenna self-capacitance can be used to communicate RF signals.

At pre-established low operating frequencies of detection IC 114, antenna element 140 behaves like a capacitor. In particular, detection IC 114 provides a detection mechanism in which antenna element 140 is essentially an electrode and behaves like a capacitor relative to ground at low frequencies including the low operating frequencies of detection IC 114. Antenna element 140 achieves a self capacitance due to a buildup of charges on a structure of antenna element 140. This self-capacitance is relatively constant for a free-field (FF) device position (e.g., when WCD 200 is placed in a hands-free position) at a low frequency operation of detection IC 114. As communication signal frequencies increase along the propagation or communication path, the antenna structure begins to resonate at the fundamental operating frequency for which antenna element 140 is designed and operates like a radiating element (i.e., an antenna). Thus, antenna element 140 operates like a radiating element for higher communication signal frequencies, while simultaneously operating like a capacitor relative to ground for the lower operating signal frequencies of detection IC 114.

At low (operating) signal frequencies of detection IC 114, as the user holds WCD 200 or presents another loading condition to WCD 200, charges on the antenna structure are altered by the capacitance of the human body. As a result, the antenna self capacitance is changed and, at the same time, the antenna impedance at the (higher) antenna operating frequency is changed as a result of near field interaction with nearby objects.

Since the antenna matching tuners are being used in an advanced open loop system, impedance of the antenna at the operating frequency is an unknown value, regardless of whether loading is presented. Therefore, the feedback from detection IC 114 is used to change tuning values of the open loop tuner (e.g., an AMTC), based on a pre-established correlation between low frequency antenna self-capacitance and antenna impedance at the operating frequency for a given loading condition presented to antenna 140 by the presence of a body part or some other object that can affect antenna impedance.

A correlation between low frequency antenna self-capacitance and antenna impedance dispersion is pre-established for a given loading condition at operating frequencies in which the antenna is designed to radiate. Based on the pre-established correlation, the advanced open loop tuning system operates efficiently with the aid of the antenna element as a sensor probe that enables detection IC 114 to receive sensor feedback.

Correlation is established by way of statistical data collection of low frequency antenna self capacitance and corresponding antenna impedance dispersion at operating frequency, for various loading conditions. Impedance dispersion versus self capacitance is mapped on a smith chart to track the correlation. In one embodiment, impedance dispersion is grouped according to light, moderate, and severe loading conditions for the corresponding self capacitance change, in an effort to minimize the number of tuning states.

A power wave concept which can be applied to determine a relationship between incident and reflected signals is used to analyze impedance dispersion. Impedance dispersion analysis using the power wave concept is utilized to calculate the mismatch losses using antenna impedance without the aid of a matching network. Antenna impedance without the aid of a matching network is analyzed to understand the trade-offs if the antenna impedance is left uncorrected for a given loading condition or is incorrectly matched to a different loading condition.

Returning to FIG. 2, modem 116 receives self capacitance change information from detection IC 114. Detection IC 114 receives the self-capacitance change information from all detect input lines 246, 248 that are hooked to respective antenna elements. Collective analysis of self capacitance change information from all detect input lines help "discriminate" the loading condition effectively. Some of these distinguishable loading conditions include left hand loading, right hand loading, and on-body loading. Furthermore, these loading conditions are clearly identifiable based on activity across all sensors located at various parts of WCD 200.

Modem 116 stores an index-based look-up table with tuning state values based on the self capacitance values that correlate to antenna impedance for a given loading condition. These particular tuning states that are identified within the table can be applied to a corresponding AMTC in order to minimize mismatch losses.

In one embodiment, modem 116 comprises an application processor (AP) (FIG. 1) and receives, from detection IC 114, object detection signal information corresponding to the multiple AEs. Whenever detection IC 114 and application processor (AP) 118 detect changes in antenna self capacitance for respective antenna elements, modem 116/AP 118 determines an antenna loading condition presented to the wireless communication device by the object located within specific proximity of corresponding antenna elements. In particular, modem 116 (i) determines the antenna loading condition by identifying a match for the received object detection signal information from among pre-established information about loading conditions, (ii) retrieves stored information identifying antenna tuning states mapped to changes in antenna self-capacitance, which stored information corresponds to the determined antenna loading condition, and (iii) determines the respective antenna tuning states to provide appropriate antenna impedance tuning from the retrieved stored information. Specifically, modem 116 determines antenna tuning states associated with each respective antenna element by using a pre-established mapping of antenna tuning states and changes in antenna self-capacitance correlated to antenna impedance. Modem 116 utilizes pre-established information that corresponds to the determined antenna loading condition to determine the appropriate antenna tuning states.

Furthermore, modem 116 sends instructions via respective control signals to each corresponding open loop tuner (e.g., an AMTC) to change the associated tuning values. Based on information contained within the stored look-up table, modem 116 performs antenna impedance tuning to offset antenna de-tuning caused by a respective proximity of the object to each of the multiple antenna elements.

The CTPSes are coupled to detection IC 114 via detect input lines. Furthermore, detection IC 114 is coupled to a respective CTPS antenna element via a corresponding RF decoupling sub-circuit within the CTPS. With the aid of an HPF network (e.g., HPF network 210) coupled between the CTPS and a corresponding AMTC, detection IC 114 is isolated from a corresponding AMTC. This isolation prevents detection IC 114 from interacting with the RFFE devices such as tuners or antenna matching networks. In particular, the HPF network presents detection IC 114 with a substantially fixed and constant capacitance (i.e., as "seen" from an input port of detection IC 114). The substantially fixed and constant capacitance is provided by the collective impact of (a) a fixed capacitor (e.g., RF Capacitor 212) and (b) a shunt inductor (e.g., shunt inductor 214) which effectively provides a direct path (from a corresponding AMTC) to ground at the low operating frequency of detection IC 114. By providing the direct path to ground at the detection IC 114 operating frequency, shunt inductor 214 prevents (an additional) capacitance from being presented to detection IC 114. As a result, the fixed and constant capacitance "seen" by detection IC 114 is substantially provided by the fixed capacitor (e.g., RF capacitor 212). Ultimately, at the low operating frequency of detection IC 114, HPF network 210 prevents additional capacitive loading associated with tuning state adjustments at a corresponding AMTC, coupled to the shunt inductor 214, from impacting or being seen by detection IC 114. In addition, the fixed and constant capacitance presented to detection IC 114 enables detection IC 114 to operate within a suitable dynamic operating range and provide a suitable and expected level of detection resolution. RF decoupling network 225 (a) prevents a propagation of RF communication signals to detection IC 114, (b) ensures that detect signals received by detection IC 114 and which indicate changes to antenna self-capacitance satisfy pre-specified power levels and (c) serves to alleviate potential desensitization at corresponding receivers as a result of noise propagated onto the respective receivers from the respective detect input lines.

Figure 3:
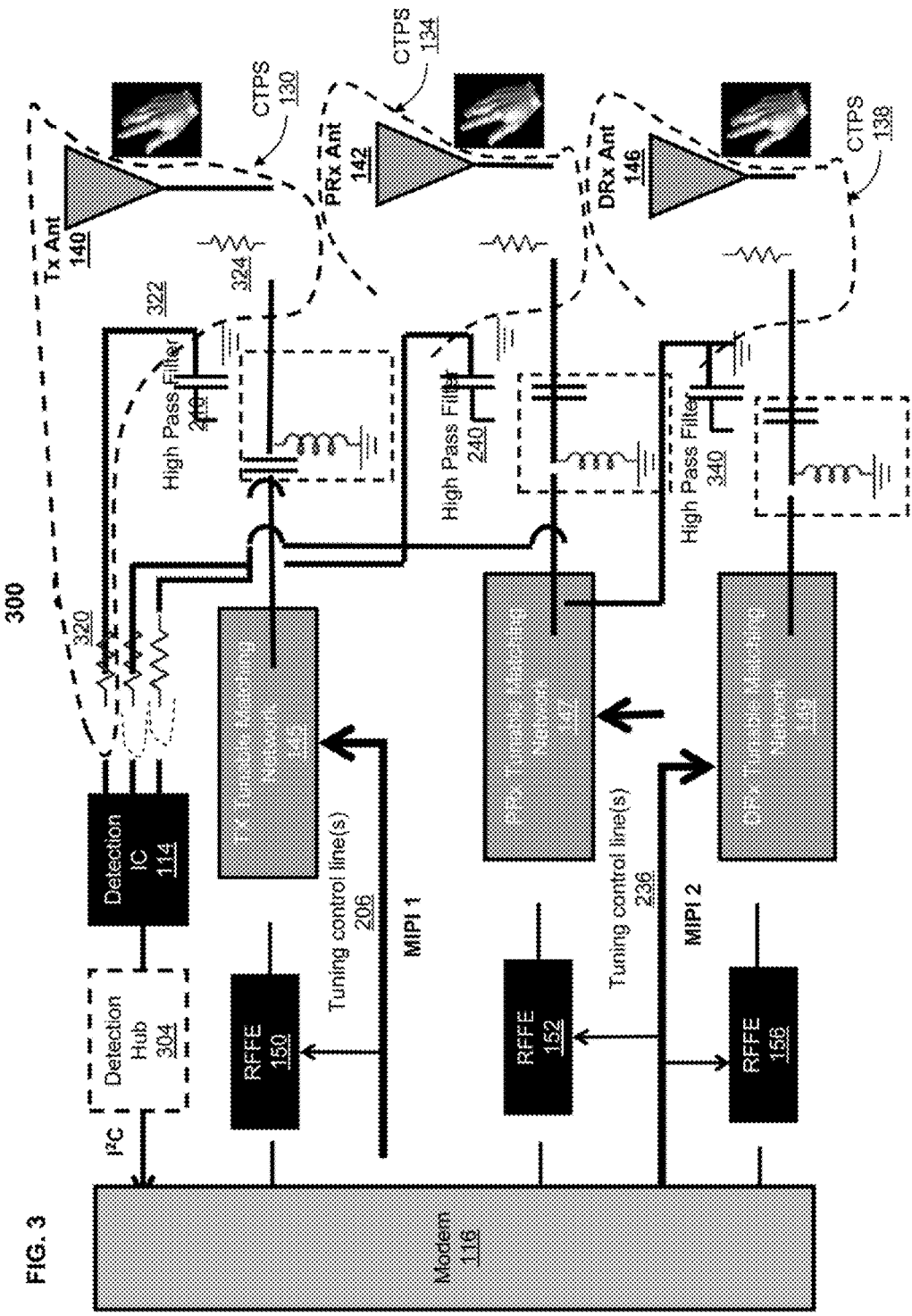
FIG. 3 is another block diagram representation of a wireless communication device which utilizes capacitive touch and proximity sensors (CTPSes), according to one embodiment.

FIG. 3 is another block diagram representation of a wireless communication device which utilizes multiples CTPSes, according to one embodiment. Similar to FIG. 2, WCD 300 comprises modem 116 and radio frequency front end (RFFE) 150, which is coupled to an output of modem 116. WCD 300 also comprises Transmit (Tx) Tunable Matching Network or AMTC 145, which is coupled to an output of RFFE 150. RFFE 150 comprises RF TX 204 (FIG. 2). In addition, AMTC 145 is coupled to modem 116 via tuning control line(s) 206. Using control lines (e.g., tuning control line(s) 206), modem 116 is able to communicate with connected circuit components including the AMTCs using any one of a number of protocols, which can include Mobile Industry Processor Interface (MIPI) protocol. WCD 300 also comprises (first) CTPS 130. AMTC 145 is communicatively coupled to CTPS 130 via high pass filter (HPF) network 210. HPF network 210 comprises shunt inductor 214 and series RF capacitor 212 which is coupled to shunt inductor 214.

CTPS 130 comprises antenna 140 and a first RF decoupling network which is coupled to antenna 140. The first RF decoupling network is similar to RF decoupling network 225 (FIG. 2) and comprises first series resistor 320, second series resistor 324 and shunt capacitor 322 coupled between the first and second series resistances 320 and 324.

WCD 300 also comprises RFFE 152, which is coupled to an input of modem 116, and Primary Receive (PRx) Tunable Matching Network or AMTC 147, which is in turn coupled to an input of RFFE 152. RFFE 152 comprises first RF RX 234 (FIG. 2). In addition, AMTC 147 is coupled to modem 116 via tuning control line(s) 236. In one implementation, tuning control line(s) 236 represent a shared communication line or data bus. WCD 300 also comprises (second) CTPS 134. AMTC 147 is communicatively coupled to CTPS 134 via high pass filter (HPF) network 240 (FIG. 2). CTPS 134 comprises antenna 142 and an RF decoupling network which is coupled to antenna 142.

WCD 300 also comprises RFFE 156 which is coupled to an input of modem 116 and Diversity Receive (DRx) Tunable Matching Network or AMTC 149 which is coupled to an input of RFFE 156. RFFE 156 comprises a second RF RX (not explicitly shown). In addition, AMTC 149 is coupled to modem 116 via tuning control line(s) 236. WCD 300 also comprises third CTPS 138. AMTC 149 is communicatively coupled to third CTPS 138 via high pass filter (HPF) network 340. Third CTPS 138 comprises antenna 146 and a RF decoupling network which is coupled to antenna 146.

WCD 300 also comprises detection IC 114. In addition, in one embodiment, WCD 300 comprises detection hub 304 which receives detection signals from various types of sensors including display sensors and CTPSes (e.g., CTPS 130) which can be used to determine antenna loading conditions. WCD 300 is able to communicate with detection hub 304 and/or detection IC 114 using any one of a number of communication protocols. For example, in one implementation, WCD 300 utilizes the Inter Integrated Circuit ($I^2C$) communication protocol to communicate with detection hub 304 and/or detection IC 114.

In one embodiment, WCD 300 comprises multiple simplex antennas only, where the multiple simplex antennas include at least one transmit antenna and at least one receive antenna. In another embodiment, WCD 300 comprises simplex and duplex antennas. In yet another, embodiment, WCD 300 comprises duplex antennas only.

In WCD 300, each of the multiple antenna elements are placed about a periphery of the device to provide (a) sensory coverage over substantially all of the device periphery and (b) a pre-specified, corresponding level of detection sensitivity for various types of antenna loading conditions.

WCD 300 utilizes multiple CTPSes, each of which comprises a corresponding antenna element, to detect changes in antenna self-capacitance. Detection IC 114 forwards signal detection information identifying the detected changes in antenna self-capacitance to modem 116. Modem 116 determines a current antenna loading condition using the detected changes in antenna self-capacitance.

An antenna loading condition presented to WCD 300 is essentially an impact of an object's presence on antenna impedance. Antenna loading conditions include the impact of (a) the presence of a user's head and hand, (b) the presence of a hand, (c) the presence of a particular hand (i.e., right hand or left hand), (d) the presence or some other specific part of the user's body and (e) the presence of some other object.

WCD 300 is able to distinguish between various loading conditions including, for example, a first loading condition associated with a right hand and a second loading condition associated with a left hand. In particular, detection IC 114 enables detection of changes in antenna self-capacitance, which detected changes match first pre-established changes in antenna self-capacitance. The matching, first pre-established changes in antenna self-capacitance are respectively associated with the multiple antenna elements. The first pre-established changes in antenna self-capacitance are collectively mapped to a first pre-established loading condition which indicates that the device is being held in the right hand. In addition, detection IC 114 enables detection of changes in antenna self-capacitance, which detected changes match second pre-established changes in antenna self-capacitance. The matching, second pre-established changes in antenna self-capacitance are respectively associated with the multiple antenna elements. The second pre-established changes are collectively mapped to a second pre-established loading condition which indicates that the device is being held in the left hand. The collective set or vector of detection signal values that is detected in response to changes in antenna self-capacitance is dependent on a pre-established placement of antenna elements within a corresponding WCD.

In one embodiment, in response to detecting changes in antenna self-capacitance that match first pre-established changes, modem 116 identifies a first loading condition in which the device is being held in the right hand as a current loading condition that impacts WCD 300. Modem 116 then determines the antenna tuning states associated with each respective antenna element by using a pre-established mapping of antenna tuning states and changes in antenna self-capacitance, corresponding to the first loading condition that is associated with the device being held in the user's right hand.

Alternatively, in response to detecting changes in antenna self-capacitance that match second pre-established changes, modem 116 identifies a second loading condition in which the device is being held in the left hand as a current antenna loading condition that impacts wireless communication device 300. Modem 116 then determines the antenna tuning states associated with each respective antenna element by using a pre-established mapping of antenna tuning states and changes in antenna self-capacitance, corresponding to the second loading condition that is associated with the device being held in the user's left hand. The antenna tuning states are respectively determined using the corresponding, detected changes in antenna self capacitance.

More generally, modem 116 determines appropriate tuning states for each AMTC, based on the antenna loading condition. In order to determine the appropriate tuning states, modem 116 utilizes pre-established antenna self-capacitance information which is mapped to antenna tuning states. These appropriate tuning states enable WCD 300 to compensate for mismatch loss due to reflection caused by detuning/loading of an antenna. The antenna tuning states which are respectively mapped to pre-established changes in antenna self-capacitance are empirically pre-determined by correlating antenna self-capacitance changes to antenna impedance changes. In particular, antenna self-capacitance changes detected using low frequency detection signals are correlated to antenna impedance changes at an operating frequency of a corresponding antenna element. As a result, modem 116 is able to change the tuning states of multiple tunable matching circuits and perform antenna tuning using (a) detected real-time changes in antenna self-capacitance and (b) pre-established mappings of antenna self-capacitance and antenna tuning states from a look-up table.

Figure 4:
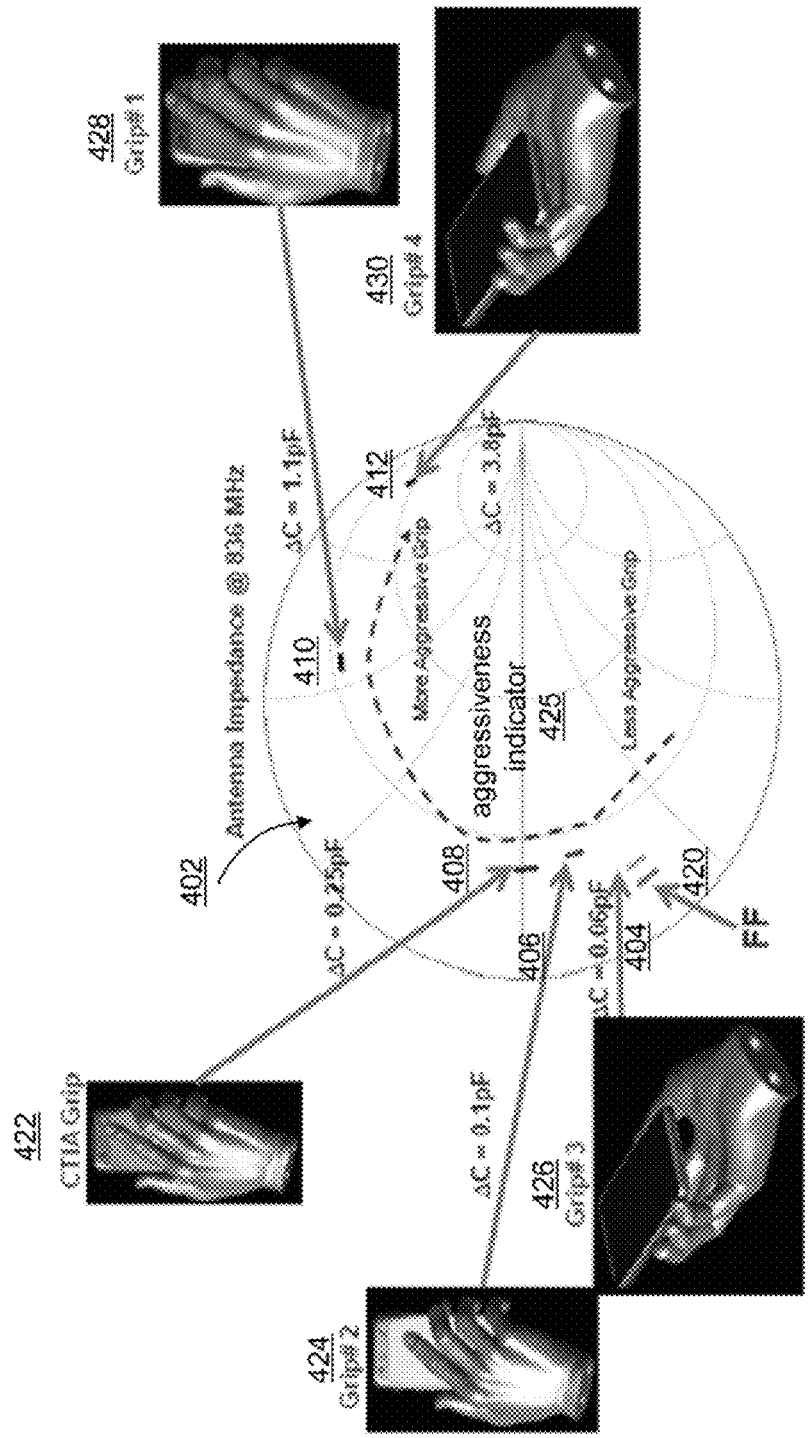
FIG. 4 illustrates a smith chart providing a plot of antenna self-capacitance change versus antenna impedance for various right hand grip positions, according to one embodiment.

FIG. 4 illustrates a smith chart providing a plot of antenna self-capacitance change versus antenna impedance for various right hand grip positions, according to one embodiment. Plot 400 provides low frequency antenna self-capacitance values and correlated antenna impedance values corresponding to an example antenna operating frequency of 836 MHz. Plot 400 is an example plot corresponding to an antenna element having a pre-established position on wireless communication device 100. As illustrated, plot 400 includes smith chart 402 having a number of data points each corresponding to an antenna self-capacitance change associated with a wireless communication device being held within a right hand grip. As illustrated, plot 400 comprises first data point 404, second data point 406, third data point 408, fourth data point 410 and fifth data point 412. First data point 404 corresponds to grip #3 image 426 and indicates a change in self-capacitance value of 0.06 pF. Second data point 406 corresponds to grip #2 image 424 and indicates a change in self-capacitance value of 0.1 pF. Third data point 408 corresponds to CTIA grip image 422 and indicates a change in self-capacitance value of 0.25 pF. Fourth data point 410 corresponds to grip #1 image 428 and indicates a change in self-capacitance value of 1.1 pF. Fifth data point 412 corresponds to grip #4 image 430 and indicates a change in self-capacitance value of 3.8 pF. In addition, plot 400 comprises reference data point 420 for antenna impedance corresponding to a free-field (FF) device position. A value of reference data point 420 for antenna self-capacitance of the antenna element is determined for a minimal antenna loading condition and/or an antenna loading condition associated with WCD 100 being placed in a hands-free position (i.e., a free-field (FF) position). Plot 400 also comprises grip "aggressiveness" indicator 425. A level of aggressiveness is correlated to change in antenna self-capacitance value, which is further correlated to antenna impedance. Based on indicator 425, grip #3 426 is a least aggressive grip while grip #4 is a most aggressive grip. A more aggressive grip indicates a larger change in antenna self-capacitance.

FIG. 5 is a table of pre-established values for antenna self-capacitance and corresponding antenna impedance values for various right hand grip positions, according to one embodiment. Table 500 comprises (a) low frequency antenna self-capacitance values that are generated using calculations and/or empirical data and (b) correlated antenna impedance values. In one embodiment, correlation is established by way of statistical data collection of low frequency antenna self capacitance and corresponding antenna impedance dispersion at an operating frequency of 836 MHz, for an example right hand grip loading condition.

The first column of table 500 identifies various pre-established right hand grips or grip positions. In one embodiment, the various right hand grips are executed using a same CTIA right hand model placed in different respective positions relative to WCD 100. A right hand grip position represents the antenna loading condition. A right hand grip loading condition can be determined from signal detection information provided using multiple antenna elements, including a first antenna element (e.g., antenna element 140). The first antenna element is a component of a CTPS (e.g., CTPS 130) which can provide antenna capacitance values correlated to antenna impedance values shown within table 500. In table 500, the antenna self-capacitance values and correlated antenna impedance values are associated with signal detection information that can be provided using a single antenna element (e.g., first antenna element 140). The second column identifies pre-established low frequency antenna self-capacitance values corresponding to various right hand grip positions identified within the first column. The third column identifies a pre-established low frequency antenna self-capacitance corresponding to a free-field (FF) device position. In table 500, the reference FF value is substantially constant at low frequencies (e.g., 130 MHz) and has a value of 1.6 pF. The fourth column identifies a change in antenna self-capacitance, which change is the difference between the self-capacitance values of column 2 and the reference "FF" value(s) identified within column 3.

The fifth column identifies reference antenna impedance "FF" values corresponding to the reference "FF" value. The reference antenna impedance values are determined using an antenna operating frequency of 836 MHz. Similar to the reference "FF" value identified within the third column which is the antenna self-capacitance at low frequency, the reference impedance "FF" values are identified by a substantially constant value which represents the antenna impedance for a free-field device position at an antenna operating frequency of 836 MHz. In the fifth column of table 500, the (single) reference antenna impedance "FF" value is identified as 5−j14.9 units of impedance. The sixth column identifies the antenna impedance values corresponding to the various antenna capacitance values associated with the various right hand grip positions for the pre-established right hand grip antenna loading condition.

Table 500 includes multiple rows of which first row 502, second row 504 and third row 506 are particularly identified. First row 502 indicates that the antenna self-capacitance associated with a standard/default CTIA right hand grip is 1.85 pF. First row 502 further indicates that given a reference "FF" self-capacitance value of 1.6 pF for a corresponding antenna element, when wireless communication device 100 is held with the standard/default CTIA right hand grip, a self-capacitance change of 0.25 pF (i.e., 1.85 pF−1.6 pF) is detected using the corresponding antenna element. Based on simulation results, the corresponding antenna impedance at an antenna operating frequency of 836 MHz is 11.8+j1.4 units of impedance. The reference "FF" antenna impedance value is 5−j14.9 units of impedance. The corresponding AMTC (e.g., 145) is then "tuned" or adjusted to match the antenna impedance 11.8+j1.4 to optimize the matching network performance by minimizing the mismatch loss.

Second row 504 indicates that the antenna self-capacitance associated with a right hand grip #1 is 2.7 pF. Second row 504 further indicates that given a reference "FF" self-capacitance value of 1.6 pF for the corresponding antenna element, when wireless communication device 100 is held in right hand grip #1, a self-capacitance change of 1.1 pF (i.e., 2.7 pF−1.6 pF) is detected using the corresponding antenna element. Based on simulation results, the corresponding antenna impedance at an antenna operating frequency of 836 MHz is 19.6+j59.2 units of impedance. The reference "FF" antenna impedance value is 5−j14.9 units of impedance. The corresponding AMTC (e.g., 145) is then "tuned" or adjusted to match the antenna impedance 19.6+j59.2 to optimize the matching network performance by minimizing the mismatch loss.

Third row 506 indicates that the antenna self-capacitance associated with a right hand grip #2 is 1.7 pF. Third row 506 further indicates that given a reference "FF" self-capacitance value of 1.6 pF for a corresponding antenna element, when wireless communication device 100 is held with right hand grip #2, a self-capacitance change of 0.1 pF (i.e., 1.7 pF−1.6 pF) is detected using the corresponding antenna element. Based on simulation results, the corresponding antenna impedance at an antenna operating frequency of 836 MHz is 13−j6.8 units of impedance. The reference "FF" antenna impedance value is 5−j14.9 units of impedance. The corresponding AMTC (e.g., 145) is then "tuned" or adjusted to match the antenna impedance 13−j16.8 to optimize the matching network performance by minimizing the mismatch loss.

FIG. 6 is a table of pre-established values for antenna self-capacitance and corresponding antenna tuning states, according to one embodiment. Table 600 provides, within the first column, two different identifiers, illustrated as Grip #1 and Grip #2, for two different sets of "hand grip positions". The second, third and fourth columns of table 600 identify values for changes in antenna self-capacitance associated with a transmit (TX) antenna (e.g., antenna element 140), a primary (P) receive (RX) antenna (e.g., antenna element 142) and a diversity (D) RX antenna (e.g., antenna element 146), respectively.

The fifth column of table 600 identifies the operating frequency for the TX antenna. The sixth, seventh and eighth columns provide respective tuning state values for first, second and third antenna tuners contained within an AMTC corresponding to the TX antenna. These tuning state values are applied to the AMTC in order to minimize antenna de-tuning associated with an identified antenna loading condition (e.g., a right hand grip loading condition).

The ninth column of table 600 identifies the operating frequency (MHz) for the P RX antenna. The tenth, eleventh and twelfth columns provide respective tuning state values for first, second and third antenna tuners contained within an AMTC corresponding to the P RX antenna. These tuning state values are applied to the AMTC in order to minimize antenna de-tuning associated with an identified antenna loading condition (e.g., the right hand grip loading condition).

The thirteenth column of table 600 identifies the operating frequency for the D RX antenna. The fourteenth, fifteenth and sixteenth columns provide respective tuning state values for first, second and third antenna tuners contained within an AMTC corresponding to the D RX antenna. These tuning state values are applied to the AMTC in order to minimize antenna de-tuning associated with an identified antenna loading condition (e.g., the right hand grip loading condition).

Table 600 comprises two rows having signal detection information and corresponding tuning state information. In the example of table 600, first row 602 is particularly identified. First row 602 indicates a first loading condition that is identifiable based on the changes in antenna capacitance values corresponding to TX antenna, P RX antenna and D RX antenna. As illustrated, the change in antenna capacitance corresponding to TX antenna is 3 pF. The change in antenna capacitance corresponding to P RX antenna is 1 pF. In addition, the change in antenna capacitance corresponding to D RX antenna is 0.5 pF.

First row 602 further indicates that for an antenna operating frequency of 824 MHz, the appropriate tuning states corresponding to the first, second and third tuners of the AMTC that is associated with the TX antenna are 3.9, 3.02 and 1.24 units corresponding to AMTC tuning state (e.g., units of voltage or capacitance), respectively. First row 602 also indicates that for an antenna operating frequency of 869 MHz, the appropriate tuning states corresponding to the first, second and third tuners of the AMTC that is associated with the P RX antenna are 2.13, 2.13 and 2.13 units corresponding to AMTC tuning state, respectively. In addition, first row 602 indicates that for an antenna operating frequency of 869 MHz, the appropriate tuning states corresponding to the first, second and third tuners of the AMTC that is associated with the D RX antenna are 3.15, 3.15 and 3.15 units corresponding to AMTC tuning state, respectively.

Figure 7:
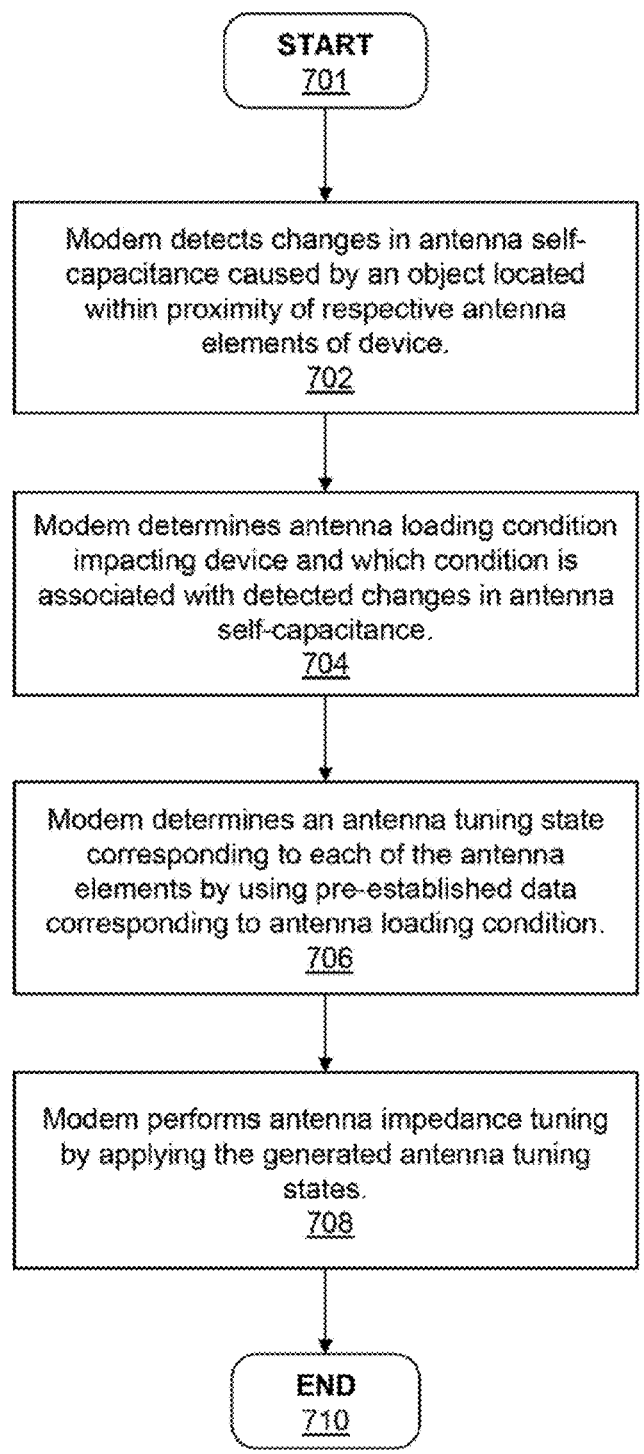
FIG. 7 is a flow chart illustrating one method for performing antenna tuning by using detected changes in antenna self-capacitance, according to one embodiment.

FIG. 7 is a flow chart illustrating an embodiment of the method by which the above processes of the illustrative embodiments can be implemented. Specifically, FIG. 7 illustrates a method for performing antenna tuning by using detected changes in antenna self-capacitance. Although the method illustrated by FIG. 7 may be described with reference to components and functionality illustrated by and described in reference to FIGS. 1-6, it should be understood that this is merely for convenience and alternative components and/or configurations thereof can be employed when implementing the method. Certain portions of the methods may be completed by CDAT utility 110 executing on one or more processors (FIG. 1). The executed processes then control specific operations of or on modem 116 and wireless communication device 100. For simplicity is describing the method, all method processes are described from the perspective of modem 116 and CDAT utility 110.

The method of FIG. 7 begins at initiator block 701 and proceeds to block 702 at which modem 116 detects changes in antenna self-capacitance caused by an object located within proximity of respective antenna elements of WCD 100. At block 704, modem 116 determines an antenna loading condition impacting WCD 100 and which condition is associated with the detected changes in antenna self-capacitance corresponding to multiple antenna elements. In one embodiment, modem 116 utilizes pre-established data about antenna loading conditions to determine a current antenna loading condition based on matching values of antenna self-capacitance changes. At block 706, modem 116 determines an antenna tuning state corresponding to each of the antenna elements by using pre-established data corresponding to the determined antenna loading condition. At block 708, modem 116 performs antenna impedance tuning by applying the generated antenna tuning states. The process ends at block 710.

The flowchart and block diagrams in the various figures presented and described herein illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Thus, while the method processes are described and illustrated in a particular sequence, use of a specific sequence of processes is not meant to imply any limitations on the disclosure. Changes may be made with regards to the sequence of processes without departing from the spirit or scope of the present disclosure. Use of a particular sequence is therefore, not to be taken in a limiting sense, and the scope of the present disclosure extends to the appended claims and equivalents thereof.

In some implementations, certain processes of the methods are combined, performed simultaneously or in a different order, or perhaps omitted, without deviating from the spirit and scope of the disclosure. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A wireless communication device comprising:
   multiple radio frequency (RF) transceivers;
   multiple antenna matching and tuning circuits (AMTCs) each respectively coupled to a corresponding RF transceiver;
   multiple antenna elements (AEs) each respectively coupled to a corresponding AMTC by a first coupling capacitor, wherein each AE is a first component of a corresponding capacitive touch and proximity sensor (CTPS);
   a detection integrated circuit (IC) communicatively coupled to each respective CTPS and which detects a change in capacitance of a corresponding CTPS caused by proximity of an object to the antenna element, while the antenna element can be used to communicate RF signals; and
   a modem coupled to the detection IC and each of the multiple RF transceivers and which:
   responsive to detection of the respective change in capacitance corresponding to each of the multiple CTPSes, determines an antenna loading condition presented to the wireless communication device by the object located within specific proximity of corresponding antenna elements, based on a detected change in antenna self-capacitance associated with a corresponding antenna element;

determines antenna tuning states associated with each respective antenna element by using a pre-established mapping of antenna tuning states and changes in antenna self-capacitance correlated to antenna impedance, based on the determined antenna loading condition; and performs antenna impedance tuning by respectively providing the determined antenna tuning states to the multiple AMTCs.

2. The wireless communications device of claim 1, wherein:

the modem comprises an application processor (AP) and (a) receives, from the detection IC, object detection signal information corresponding to the multiple AEs; (b) determines the antenna loading condition by identifying a match for the received object detection signal information from among pre-established information about loading conditions; (c) retrieves stored information identifying antenna tuning states mapped to changes in antenna self-capacitance, based on the determined antenna loading condition; (d) determines the respective antenna tuning states to provide appropriate antenna impedance tuning, from the retrieved stored information; and (e) transmits a respective control signal to each AMTC to provide an appropriate antenna tuning to offset antenna de-tuning caused by a respective proximity of the object to each of the multiple antenna elements.

3. The wireless communications device of claim 1, wherein:

the multiple antenna elements comprise multiple simplex antennas including at least one transmit antenna and at least one receive antenna.

4. The wireless communications device of claim 1, wherein:

the multiple antenna elements are at least one of (a) a set of simplex antennas and (b) a set of duplex antennas.

5. The wireless communications device of claim 1, wherein:

each of the multiple AMTCs is communicatively coupled to a corresponding high pass filter circuit that comprises a shunt inductor and a series capacitor coupled to the shunt inductor, wherein the high pass filter circuit isolates the detection IC from a corresponding AMTC by preventing the additional capacitive loading associated with tuning state adjustments at a corresponding AMTC from impacting a low frequency operation of the detection IC, wherein the high pass filter circuit enables the detection IC to attain operation within a suitable dynamic operating range and provide a suitable and expected level of detection resolution.

6. The wireless communications device of claim 5, wherein:

the detection IC is respectively communicatively coupled via multiple RF decoupling circuits to the antenna elements, wherein the RF decoupling circuits (a) prevent a propagation of RF communication signals to the detection IC, (b) ensure that detect signals which indicate changes in antenna self-capacitance satisfy pre-specified power levels and (c) serve to alleviate potential desensitization at corresponding receivers as a result of noise propagated onto the respective receivers from the respective detect input lines.

7. The wireless communications device of claim 1, wherein:

each of the multiple antenna elements are placed about a periphery of the wireless communication device to provide (a) sensory coverage over substantially all of the device periphery and (b) a pre-specified, corresponding level of sensitivity for various types of antenna loading conditions.

8. The wireless communications device of claim 1, wherein the detection IC:

enables detection of (a) changes in antenna self-capacitance, which changes match first pre-established changes in antenna self-capacitance respectively associated with the at least one antenna element, wherein said first pre-established changes are collectively mapped to a first pre-established loading condition which indicates that the device is being held in the right hand, and (b) changes in antenna self-capacitance, which changes match second pre-established changes in antenna self-capacitance respectively associated with the at least one antenna element, wherein said second pre-established changes are collectively mapped to a second pre-established loading condition which indicate that the device is being held in the left hand.

9. The wireless communications device of claim 8, wherein the modem:

in response to detecting changes in antenna self-capacitance, which changes match first pre-established changes, identifies a first loading condition in which the device is being held in the right hand as a current loading condition that impacts the wireless communication device; and determines the antenna tuning states associated with respective antenna elements by using a pre-established mapping of antenna tuning states and changes in antenna self-capacitance, corresponding to the first loading condition that is associated with the device being held in the user's right hand; and in response to detecting changes in antenna self-capacitance, which changes match second pre-established changes, identifies a second loading condition in which the device is being held in the left hand as a current loading condition that impacts the wireless communication device; and determines the antenna tuning states associated with respective antenna elements by using a pre-established mapping of antenna tuning states and changes in antenna self-capacitance, corresponding to the second loading condition that is associated with the device being held in the user's left hand; and wherein the antenna tuning states are respectively determined using the corresponding, detected changes in antenna self capacitance.

10. The wireless communications device of claim 1, wherein:

the detection IC operates at a pre-established low frequency to detect changes in antenna self-capacitance; and a correlation between low frequency antenna self-capacitance and changes in antenna impedance for a given antenna loading condition at antenna operating frequency is pre-established to provide information that can be used within the wireless communication device in an open loop antenna tuning system that utilizes pre-established information, wherein the pre-established information is used to perform antenna tuning to compensate for antenna de-tuning using real-time changes in antenna self-capacitance.

11. In a wireless communications device having multiple antenna elements that are capacitively coupled to antenna matching and tuning circuits (AMTCs), respectively, and are each connected to at least one radio frequency (RF) choke to constitute a corresponding capacitive touch and proximity sensor (CTPS), a method comprising:

a detection integrated circuit (IC) detecting a change in antenna self-capacitance caused by an object located within specific proximity of a corresponding antenna element for each antenna element of a wireless communication device;

determining an antenna loading condition presented to the wireless communication device by the object located within specific proximity of corresponding antenna elements, based on a detected change in antenna self-capacitance associated with a corresponding antenna element;

determining an antenna tuning state corresponding to each of the antenna elements by using a pre-established mapping of antenna tuning states and changes in antenna self-capacitance correlated to antenna impedance, based on the determined antenna loading condition; and performing antenna impedance tuning by using the generated antenna tuning states.

12. The method of claim 11, further comprising:

detecting the change in antenna self-capacitance caused by a proximate object using object detection signal information corresponding to the multiple AEs;

determining the antenna loading condition by identifying a match for the object detection signal information from among pre-established information for defining loading conditions;

retrieving stored information identifying antenna tuning states mapped to changes in antenna self-capacitance, based on the determined antenna loading condition, in order to determine the respective antenna tuning states to provide appropriate antenna impedance tuning; and transmitting a respective control signal to each AMTC to provide an appropriate antenna tuning to offset antenna de-tuning caused by a respective proximity of the object to each of the multiple antenna elements.

13. The method of claim 11, wherein:

the multiple antenna elements comprise multiple simplex antennas including at least one transmit antenna and at least one receive antenna.

14. The method of claim 11, wherein:

the multiple antenna elements are at least one of (a) a set of simplex antennas and (b) a set of duplex antennas.

15. The method of claim 11, wherein:

each of the multiple AMTCs is communicatively coupled to a corresponding high pass filter circuit that comprises a shunt inductor and a series capacitor coupled to the shunt inductor, wherein the high pass filter circuit isolates the detection IC from a corresponding AMTC by preventing the additional capacitive loading associated with tuning state adjustments at a corresponding AMTC from impacting a low frequency operation of the detection IC, wherein the high pass filter circuit enables the detection IC to attain operation within a suitable dynamic operating range and provide a suitable and expected level of detection resolution.

16. The method of claim 15, wherein:

the detection IC is respectively communicatively coupled via multiple RF decoupling circuits to the antenna elements, wherein the RF decoupling circuits (a) prevent a propagation of RF communication signals to the detection IC, (b) ensure that detect signals which indicate changes in antenna self-capacitance satisfy pre-specified power levels and (c) serve to alleviate potential desensitization at corresponding receivers as a result of noise propagated onto the respective receivers from the respective detect input lines.

17. The method of claim 11, wherein:

each of the multiple antenna elements are placed about a periphery of the wireless communication device to provide (a) sensory coverage over substantially all of the device periphery and (b) a pre-specified, corresponding level of sensitivity for various types of antenna loading conditions.

18. The method of claim 11, wherein the detection IC:

enables detection of (a) changes in antenna self-capacitance, which changes match first pre-established changes in antenna self-capacitance respectively associated with the at least one antenna element, wherein said first pre-established changes are collectively mapped to a first pre-established loading condition which indicates that the device is being held in the right hand, and (b) changes in antenna self-capacitance, which changes match second pre-established changes in antenna self-capacitance respectively associated with the at least one antenna element, wherein said second pre-established changes are collectively mapped to a second pre-established loading condition which indicate that the device is being held in the left hand.

19. The method of claim 18, wherein the modem:

in response to detecting changes in antenna self-capacitance, which changes match first pre-established changes, identifies a first loading condition in which the device is being held in the right hand as a current loading condition that impacts the wireless communication device; and determines the antenna tuning states associated with respective antenna elements by using a pre-established mapping of antenna tuning states and changes in antenna self-capacitance, corresponding to the first loading condition that is associated with the device being held in the user's right hand; and in response to detecting changes in antenna self-capacitance, which changes match second pre-established changes, identifies a second loading condition in which the device is being held in the left hand as a current loading condition that impacts the wireless communication device; and determines the antenna tuning states associated with respective antenna elements by using a pre-established mapping of antenna tuning states and changes in antenna self-capacitance, corresponding to the second loading condition that is associated with the device being held in the user's left hand; and wherein the antenna tuning states are respectively determined using the corresponding, detected changes in antenna self capacitance.

20. The method of claim 11, wherein:

the detection IC operates at a pre-established low frequency to detect changes in antenna self-capacitance; and a correlation between low frequency antenna self-capacitance and changes in antenna impedance for a given antenna loading condition at antenna operating frequency is pre-established to provide information that can be used within the wireless communication device in an open loop antenna tuning system that utilizes pre-established information, wherein the pre-established information is used to perform antenna tuning to compensate for antenna de-tuning using real-time changes in antenna self-capacitance.

* * * * *